United States Patent
Taniguchi et al.

(10) Patent No.: US 7,411,620 B2
(45) Date of Patent: Aug. 12, 2008

(54) MULTILAYER DEPOSITION MULTIPIXEL IMAGE PICKUP DEVICE AND TELEVISION CAMERA

(75) Inventors: Masato Taniguchi, Kanagawa (JP); Shunji Takada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 697 days.

(21) Appl. No.: 11/082,697

(22) Filed: Mar. 18, 2005

(65) Prior Publication Data
US 2005/0205958 A1    Sep. 22, 2005

(30) Foreign Application Priority Data
Mar. 19, 2004   (JP)   ............ P. 2004-080617

(51) Int. Cl.
H04N 3/14   (2006.01)
H04N 5/335   (2006.01)
(52) U.S. Cl. ............ 348/294; 348/302; 348/311
(58) Field of Classification Search ............ 348/294, 348/302, 311
See application file for complete search history.

(56) References Cited

U.S. PATENT DOCUMENTS

| | | | |
|---|---|---|---|
| 5,965,875 A | 10/1999 | Merrill | |
| 7,132,724 B1 * | 11/2006 | Merrill | 257/440 |
| 2003/0209651 A1 | 11/2003 | Iwasaki | |
| 2005/0194653 A1 * | 9/2005 | Hynecek et al. | 257/443 |
| 2006/0054987 A1 * | 3/2006 | Nii | 257/440 |

FOREIGN PATENT DOCUMENTS

| | | |
|---|---|---|
| JP | 58-103165 A | 6/1983 |
| JP | 3315213 B2 | 6/2002 |

* cited by examiner

Primary Examiner—James M Hannett
(74) Attorney, Agent, or Firm—Sughrue Mion, PLLC

(57) ABSTRACT

A multilayer deposition multipixel image pickup device comprising a pixel unit, wherein the pixel unit comprises: a plurality of electromagnetic absorption layers being capable of absorbing electromagnetic waves of different wavelengths and performing photoelectric conversion; at least one pair of electrodes that sandwich each of electromagnetic absorption layers; a charge transfer and charge read part; and a plurality of contact parts that couple at least one of the electrodes and the charge transfer and charge read part, wherein a length between outermost surfaces of ones among electrodes of the pixel unit is smaller than a pixel size that is a circle-equivalent diameter of the same area as a first electromagnetic absorption layer of the electromagnetic absorption layers, the first electromagnetic absorption layer having a largest area in said plurality of electromagnetic absorption layers.

21 Claims, 8 Drawing Sheets

(1) PREPARE INSULATING FILM (2) MAKE ELECTRODE HOLE WITH RESIST (3) COMPLETE ELECTRODE HOLE

MULTILAYER DEPOSITION MULTIPIXEL IMAGE PICKUP DEVICE AND TELEVISION CAMERA

BACKGROUND OF THE INVENTION

1. Field of the Invention

This invention relates to a multilayer deposition multipixel image pickup device used with digital camera, television camera image pickup, etc., and in particular to a highly sensitive multilayer deposition multipixel image pickup device with a large number of pixels.

2. Description of the Related Art

The competition in developing image pickup devices for still images by the manufacturers proceeds after advance notice of market introduction of electronic still cameras in 1982, especially after the advent of digital cameras in 1995. The theme of the development is to provide the device with a large number of pixels by making pixels finer, and when the 21st century is entered, an image pickup device with a pixel size of 3μ has also been realized (refer to CCD/CMOS image sensor nokisotoouyou, written by YONEMOTO Kazuya, published by CQ Shuppansha, page 16).

A conceptual drawing of a color image pickup device in a relate art is provided in FIG. 21 of U.S. 2003/0209651A1. In a single plate system shown in the drawing, a part of light is absorbed in a color filter and the sensitivity is degraded. For example, light passes through a red filter, whereby blue and green are lost in color filter, and only one third of light at the maximum is used. Making finer pixels is equivalent to lessening the area of a color filter 701 in the drawing and thus there is a tradeoff between making finer pixels and the sensitivity. Thus, in the single plate system, it is difficult to provide compatibility between making finer pixels and ensuring the necessary sensitivity in theory.

The technical conception of the multilayer deposition multipixel image pickup device was proposed from long ago as disclosed in JP-A-58-103165. The deposition type would eliminate the need for a color filter accompanied by a loss of light and the need for a complicated step of a microlens, etc., and would be able to also enhance the light use area percentage of each color and therefore the merit of becoming means for breaking through the tradeoff between making finer pixels and the sensitivity was recognized sufficiently, but it was not followed by development of an art for embodying it.

Then, the concept of the multilayer deposition type was embodied by a method commonly called Foveon system for separating color in the depth direction by a deposition light reception section using wavelength dependency of the absorption coefficient of Si as disclosed in U.S. Pat. No. 5,965,875. However, in the invention disclosed in U.S. Pat. No. 5,965,875, there is a tradeoff between the sensitivity and color separation property and either becomes unsatisfactory.

As a mode of the system improving the color separation property, U.S. 2003/0209651A1 discloses a system using a light reception section of an organic semiconductor and an inorganic semiconductor photosensitive layer on a Si substrate in combination. That is, FIG. 1 of the specification of U.S. 2003/0209651A1 discloses an image pickup device having a configuration wherein green color is received in a first light reception section, blue color is received in a second light reception section after passing through the first light reception section, and red color is received in a third light reception section after passing through the first and second light reception sections.

Further, Japanese Patent No. 3315213 also discloses a multilayer deposition multipixel image pickup device having multilayer organic monolayer (molecular film) light reception elements for absorbing light of different colors deposited on an Si substrate.

However, the deposition multipixel image pickup device having an array of pixels on the substrate, the pixels provided by depositing light reception elements each made up of an electromagnetic absorption and photoelectric conversion part, a charge transfer and read part, and a plurality of contact parts for coupling both the parts is more excellent in sensitivity than the single plate system having an array of undeposited pixels, but higher sensitivity is still required. The deposition multipixel image pickup device is inferior in color separation to the single plate system for separating color light through an optical filter, and the resolution tends to become unsatisfactory as compared with the single plate system. Because of the deposition structure, shading also easily occurs.

The pixel size becomes smaller and the sensitivity becomes lower with the progress of a higher number of pixels to provide a fine image. Thus, still higher sensitivity and improvement in degradation of the image quality accompanying deposition are also required for the deposition multipixel image pickup device advantageous for higher sensitivity.

The above-described related arts and knowledge relevant to the invention are described in the following documents:

SUMMARY OF THE INVENTION

It is therefore an object of the invention to provide a high-sensitivity and high-resolution image pickup device with no occurrence of shading.

It is a further object of the invention to provide an image pickup device having high photoelectric conversion efficiency and being excellent in stability at the repetitive use time.

To the ends, the invention is accomplished by thinning electromagnetic absorption and photoelectric conversion part of multiple layers relative to the pixel size in a multilayer deposition multipixel image pickup device made up of electromagnetic absorption and photoelectric conversion part of multiple layers, a charge transfer and charge read part, and a plurality of contact parts for coupling both the parts. That is, the configurations of the invention are as follows:

(1) A multilayer deposition multipixel image pickup device comprising a pixel unit, wherein the pixel unit comprises: a plurality of electromagnetic absorption layers being capable of absorbing electromagnetic waves of different wavelengths and performing photoelectric conversion; at least one pair of electrodes that sandwich each of electromagnetic absorption layers; a charge transfer and charge read part; and a plurality of contact parts that couple at least one of the electrodes and the charge transfer and charge read part, wherein a length between outermost surfaces of ones among electrodes of the pixel unit is smaller than a pixel size that is a circle-equivalent diameter of the same area as a first electromagnetic absorption layer of the electromagnetic absorption layers, the first electromagnetic absorption layer having a largest area in said plurality of electromagnetic absorption layers.

(2) The multilayer deposition multipixel image pickup device as described above in (1) wherein at least one of said plurality of electromagnetic absorption layers absorbs any of blue light, green light, red light, ultraviolet light, infrared light, X rays, and γ rays and performs the photoelectric conversion.

(3) The multilayer deposition multipixel image pickup device as described above in (1), wherein said plurality of electromagnetic absorption layers have at least three electromagnetic absorption layers for absorbing 400-500 nm blue light, 500-600 nm green light, and 600-700 nm red light and performing the photoelectric conversion.

(4) The multilayer deposition multipixel image pickup device as described above in any of (1) to (3), wherein the charge transfer and charge read part is a semiconductor having charge mobility of 100 cm$^2$/volt sec or more.

(5) The multilayer deposition multipixel image pickup device as described above in any of (1) to (4), wherein the charge transfer and charge read part has one of a CMOS structure and a CCD structure.

(6) The multilayer deposition multipixel image pickup device as described above in any of (1) to (5), wherein said plurality of contact parts comprise metal material.

(7) The multilayer deposition multipixel image pickup device as described above in any of (1) to (6), wherein said plurality of contact parts include at least three contact parts for coupling an electrode for taking out blue light and the charge transfer and charge read part, coupling an electrode for taking out green light and the charge transfer and charge read part, and coupling an electrode for taking out red light and the charge transfer and charge read part.

(8) The multilayer deposition multipixel image pickup device as described above in any of (1) to (7), wherein the pixel size is 2 to 20 μm.

(9) The multilayer deposition multipixel image pickup device as described above in any of (1) to (8), wherein the image pickup device comprises 1M to 100M pixels.

(10) The multilayer deposition multipixel image pickup device as described above in any of (1) to (9), wherein said plurality of electromagnetic absorption layers absorb 40% or more of incident visible light of 400 to 700 nm as a whole and the perform photoelectric conversion.

(11) The multilayer deposition multipixel image pickup device as described above in any of (1) to (10), wherein an electromagnetic absorption layer having the maximum open area ratio among said plurality of electromagnetic absorption layers has an open area ratio of 70% or more.

(12) The multilayer deposition multipixel image pickup device as described above in any of (1) to (11), wherein said plurality of electromagnetic absorption layers comprise four electromagnetic absorption layers for absorbing at least blue light, blue green light, green light, and red light.

(13) The multilayer deposition multipixel image pickup device as described above in any of (1) to (12), wherein at least one of the electromagnetic absorption layer for absorbing blue light, the electromagnetic absorption layer for absorbing green light, and the electromagnetic absorption layer for absorbing red light is comprises two or more electromagnetic absorption layers.

(14) The multilayer deposition multipixel image pickup device as described above in any of (1) to (13), wherein at least one of said plurality of electromagnetic absorption layers comprises an organic compound film.

(15) The multilayer deposition multipixel image pickup device as described above in (14), wherein at least one of said plurality of electromagnetic absorption layers comprises a plurality of organic compound films.

(16) The multilayer deposition multipixel image pickup device as described above in any of (1) to (15), wherein at least one of said plurality of electromagnetic absorption layers contains oxide or chalcogenide semiconductor and spectral sensitization coloring matter.

(17) The multilayer deposition multipixel image pickup device as described above in any of (1) to (16), wherein at least one of said plurality of electromagnetic absorption layers contains at least one of: inorganic compound particles; an inorganic compound thin film; and a complex of the inorganic compound particles and the inorganic compound thin film.

(18) A broadcasting television camera comprising an image pickup device as described above in any of (1) to (17).

(19) The broadcasting television camera as described above in (18) comprising no optical low-pass filter.

(20) The broadcasting television camera as described above in (18) or (19) wherein the image pickup device can be changed.

(21) The broadcasting television camera as described above in any of (18) to (20) wherein the broadcasting television camera is used for high-definition broadcasting.

(22) A digital camera using an image pickup device as described above in any of (1) to (17).

The invention is characterized by the fact that although multiple layers of electromagnetic absorption and photoelectric conversion part are deposited, the deposition thickness (precisely, the length between the outermost surfaces of the electrodes on both the outermost sides among a plurality of electrodes of a pixel unit) is made thinner than the pixel size and that it was found that a high-sensitivity and high-resolution image pickup device with no occurrence of shading can be realized if the pixel density is made high by realizing the thickness condition.

If the pixel density is made high, high photoelectric conversion efficiency is maintained and an image pickup device excellent in stability at the repetitive use time can be realized.

Therefore, the superiority of the invention becomes noticeable as the pixels are put into high density and small size; if the pixel size is 2 to 20 microns, it is further preferred as a high-sensitivity and high-resolution image pickup device with no occurrence of shading. If the pixel size is in the range, it is also further preferred as an image pickup device having high photoelectric conversion efficiency and excellent in stability at the repetitive use time.

DETAILED DESCRIPTION OF THE INVENTION

In the invention, the pixel size refers to the size of an image pickup device corresponding to the component unit of an output image (pixel of output image), namely, the size of a unit element made up of a pair of an electromagnetic absorption and photoelectric conversion part and a charge read part deposited on each other and a pair of electrodes sandwiching the parts. The unit element is made up of multiple electromagnetic absorption layers and therefore precisely refers to the circle-equivalent diameter of the same area as the layer of the largest area of the electromagnetic absorption layers. The thickness of electromagnetic absorption and photoelectric conversion part of a plurality of layers precisely refers to the length between the outermost surfaces of the electrodes on both the outermost sides among a plurality of electrodes of a pixel unit.

Although a pair of electrodes sandwiches each of the electromagnetic absorption layers, electrodes between two electrodes can be provided as a common electrode between the two electrodes to preferably reduce the number of constructional elements.

For convenience of the description of an embodiment of the invention, a typical CCD and the image pickup device in U.S. Pat. No. 5,965,875 and the image pickup device in U.S. 2003/0209651A1 will be discussed briefly and then an embodiment of a multilayer deposition multipixel image pickup device will be discussed in comparison with the CCD and the image pickup devices.

Figure 1:
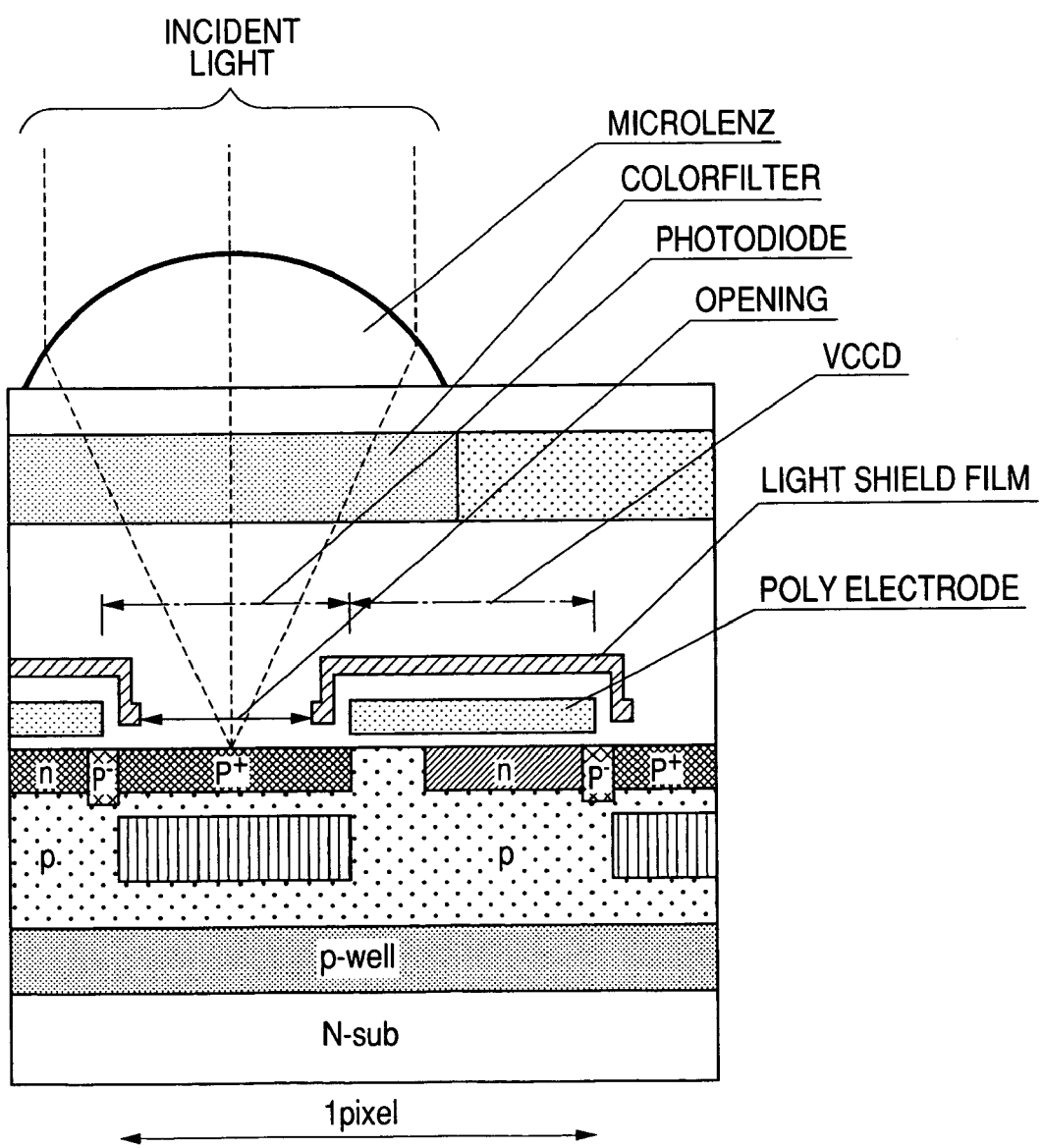
FIG. 1 is a cross-sectional structural drawing of a general-purpose CCD in the horizontal direction thereof for reference to describe the invention.

To begin with, FIG. 1 shows the horizontal structure of a general-purpose CCD. Component names in FIG. 1 are described in the figure. In FIG. 1, incident light is gathered through a microlens formed on the top of each pixel of the CCD and is incident on an electromagnetic absorption and photoelectric conversion part (crosshatch written as P+ and its lower vertical stripes and the arrow written as photodiode indicates the size) through a color filter. As the incident light passes through the color filter, colors are separated and each color light is absorbed, excited, and photoelectric-converted in the photodiode and is accumulated in the photodiode as signal charge. The pixel size is the range indicated by the arrow written as 1 pixel at the bottom of FIG. 1. As seen in FIG. 1, in the structure of the CCD, the light that can be used is limited to the light passing through the opening of a light shield film and thus if the microlens demonstrates the light gathering action, only the light in the range narrower than the pixel size is used.

In the photodiode, the signal charge is once accumulated in the hatched portion written as n+ of the charge read and transfer part written as VCCD and then is read as an electric image signal and is transferred. The charge read and transfer part is covered with light shield film so as not receive the effect of light.

The problems of the general-purpose CCD shown here are (1) the structure is complicated and the manufacturing load is large, (2) the effective use efficiency of light is low and it is difficult to make sensitivity higher, (3) because of mosaic structure, moire easily occurs and low-pass filter false signal easily appears, and (4) because of microlens, shading occurs an load for packaging is large.

To improve the above-described problems of the general-purpose CCD, the deposition picture element is proposed in JP-A-58-103165, and one of the embodiments of the concept is U.S. Pat. No. 5,965,875. Then, the structure of the Foveon deposition picture element in U.S. Pat. No. 5,965,875 will be discussed with FIG. 2.

Figure 2:
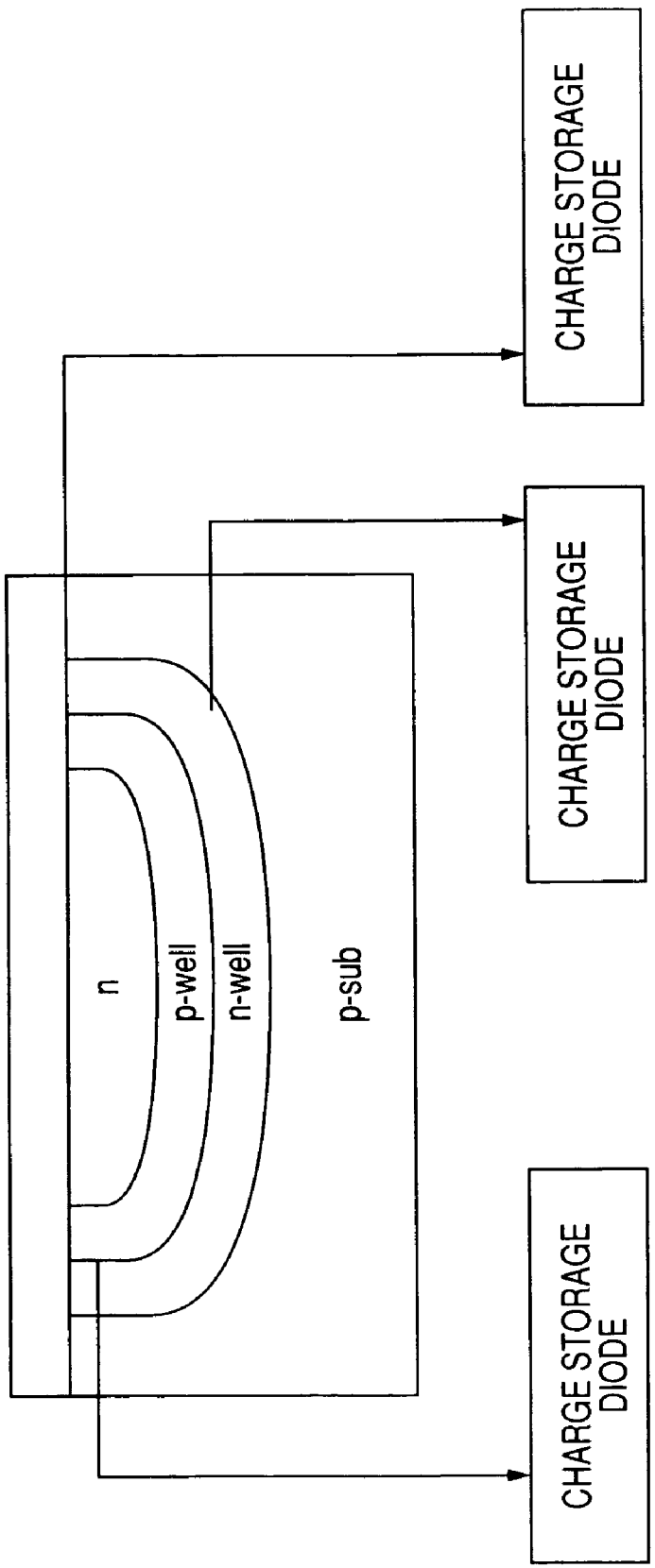
FIG. 2 is a sectional view to show the pixel structure of a deposition picture element of a Foveon type inorganic semiconductor for reference.

FIG. 2 is a sectional view to show the pixel structure of the deposition picture element of a Foveon type inorganic semiconductor. FIG. 2 shows one pixel and shows the multilayer structure of electromagnetic wave (generally, light wave) absorption area of multiple layers written as n, p-well, n-well, and p-sub from the surface side on an Si substrate. The electromagnetic wave incident on the area is absorbed in the order of higher energy, namely, if the electromagnetic wave is light, it is absorbed in order starting at blue light of a short wavelength and red light is absorbed in the depth part. The absorbed electromagnetic wave undergoes photoelectric conversion and is accumulated. If the electromagnetic wave is light, the electrons derived from the blue right absorbed in the n area are stored in a charge storage diode at the lower right end of FIG. 2, the electrons derived from the green right absorbed in the p-well area are stored in a charge storage diode at the center of the bottom of FIG. 2, and the electrons derived from the red right absorbed in the n-well area are stored in a charge storage diode at the lower left end of FIG. 2, and they are transferred as electric image signal.

The deposition element in FIG. 2 can be put into higher sensitivity in that multiple electromagnetic waves can be absorbed in one pixel because of deposition; in contrast, spectral separation of electromagnetic wave is hard to conduct and thus the color of a reproduced image is impure, resulting in degradation of the image quality; this is a problem.

Improvement in color mixing of the element in FIG. 2 is proposed in U.S. 2003/0209651A1.

Figure 3:
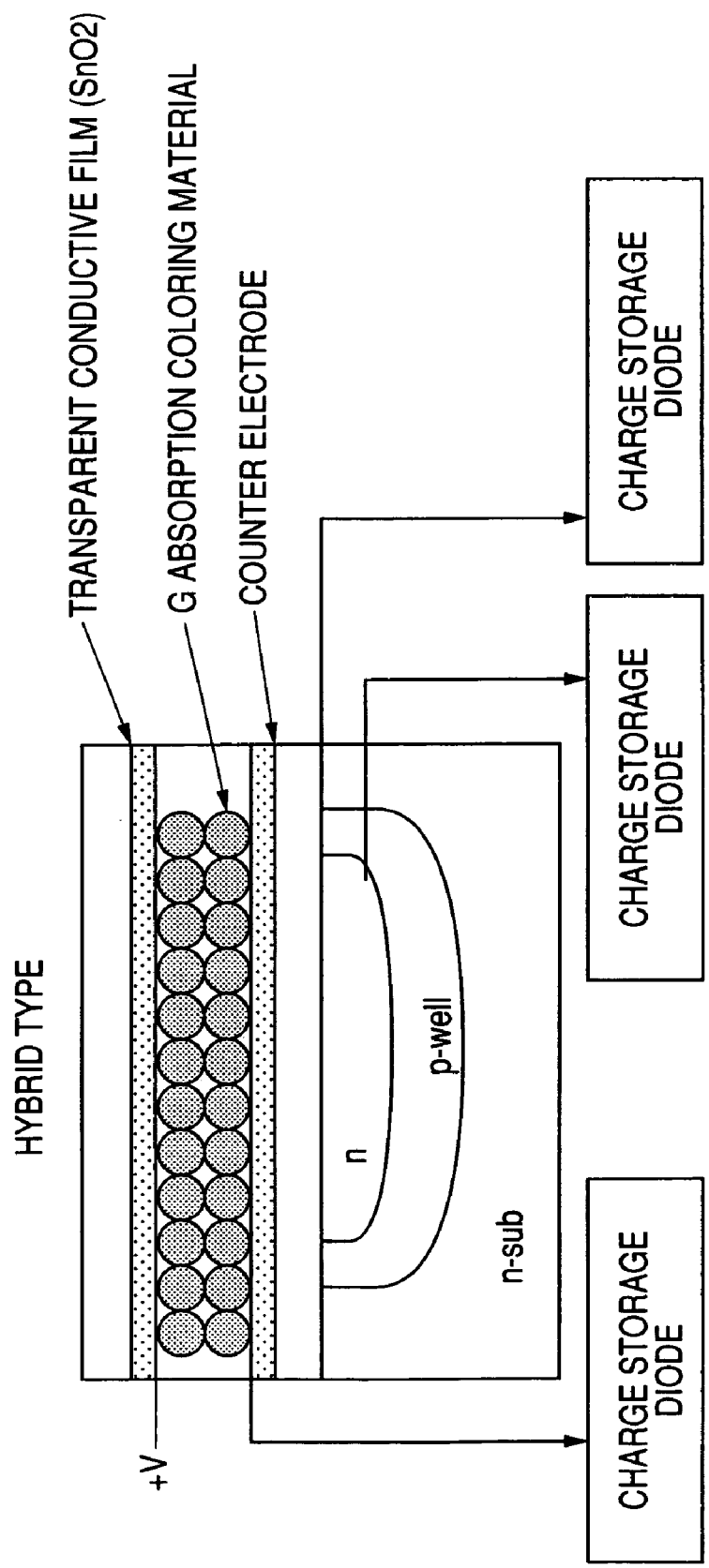
FIG. 3 is a sectional view to show the pixel structure of a hybrid deposition picture element for reference.

FIG. 3 is a sectional view to show the pixel structure of a deposition picture element called hybrid (type) in the specification using an inorganic semiconductor and an organic photoelectric conversion body. In FIG. 3, the green light absorption layer in the deposition structure of the Si semiconductor shown in FIG. 2 is replaced with a photosensitive element made of photoelectric conversion organic coloring matter having green absorbency on the surface of the Si substrate. This photosensitive element is made up of a transparent surface protective layer, a transparent conductive film, a photoelectric conversion organic coloring matter monolayer (molecular film) having green absorbency, and a counter electrode from the surface side, and absorbs green light and generates an electric image signal of green light by photoelectric conversion. Therefore, the light reception section implemented as the inorganic semiconductor becomes a photoelectric conversion layer for absorbing blue light and red light, so that color separation of red, green, and blue is improved.

The improvement effect of the hybrid type is recognized, however, the effect is insufficient. Since the electromagnetic absorption and photoelectric conversion part containing the organic coloring matter monolayer (molecular film) is provided, the total thickness of the photosensitive element of the element is large.

Figure 4:
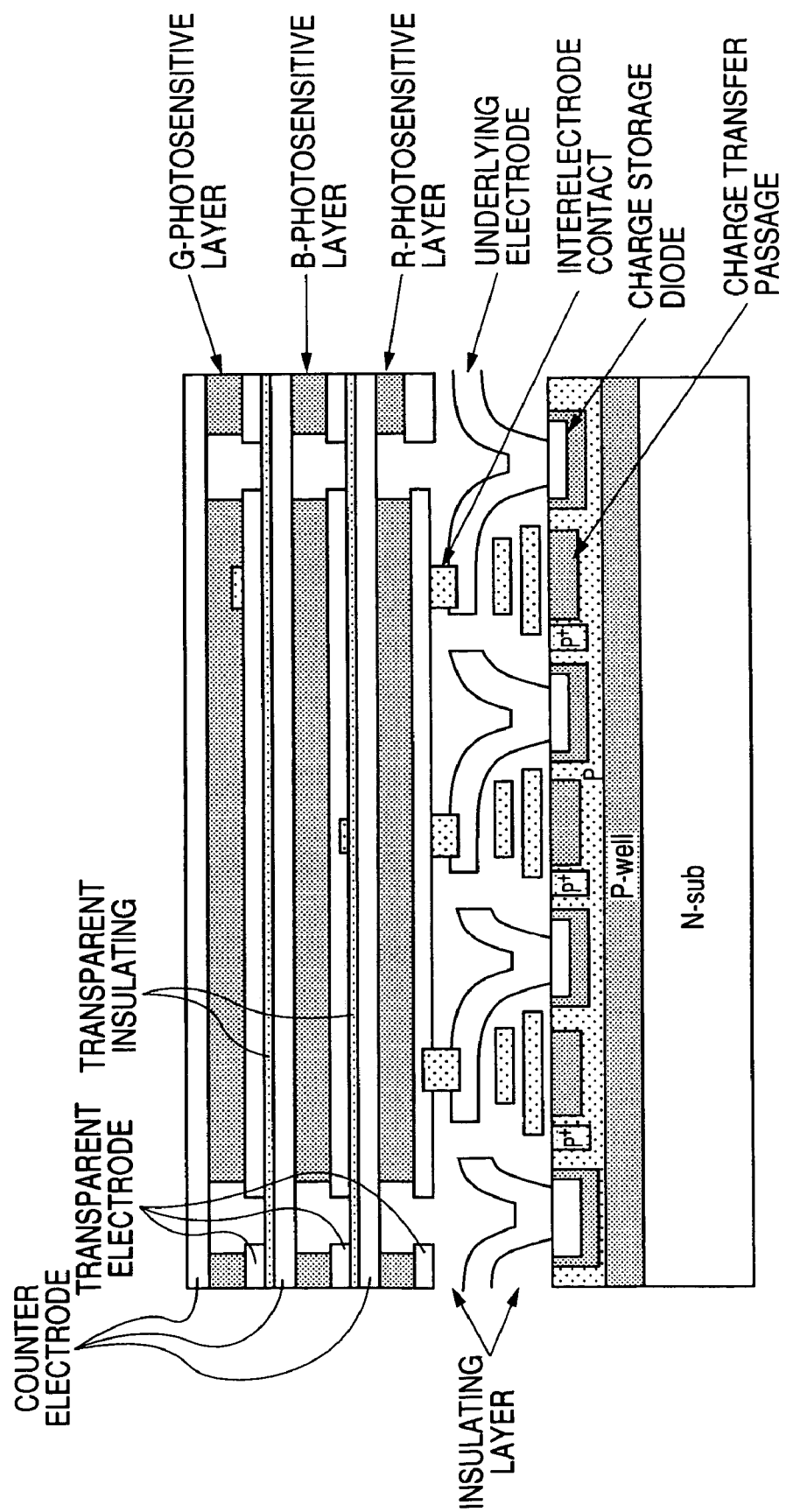
FIG. 4 is a sectional view of a typical multilayer deposition multipixel image pickup device of the invention.

A multilayer deposition multipixel image pickup device of the invention will be discussed. FIG. 4 is a sectional view of a typical multilayer deposition multipixel image pickup device of the invention. As shown in FIG. 4, the multilayer deposition multipixel image pickup device of the invention is made up of transparent counter electrodes, green, blue, and red photosensitive units, insulating layers each between the units, an underlying electrode, and a signal read and transfer layer where a charge storage diode and a charge transfer passage are disposed from the surface side, and the deposition structure is provided on the Si substrate written as N-sub in FIG. 4. Each of the green, blue, and red photosensitive units is made up of a pair of a photosensitive layer and a transparent electrode layer for absorbing different color light and executing photoelectric conversion. An interelectrode contact makes possible continuity between each of the green, blue, and red photosensitive units and the underlying electrode. Preferably, a thin film of organic coloring matter molecules, an inorganic Si layer subjected to spectral sensitization with organic coloring matter, or the like can be used as each photosensitive layer. Preferably, a CCD or CMOS is used as the charge transfer passage.

Here, the thickness of electromagnetic absorption and photoelectric conversion part refers to the length between the outermost surfaces of the electrodes on both the outermost sides among a plurality of electrodes of the pixel unit according to the above-described definition and in FIG. 4, is the length from the surface of the counter electrode on the top surface to the underlying transparent electrode below the red photosensitive unit. The pixel size is the distance between both partitions of the pixel unit with the green, red, and blue photosensitive layers put on each other in FIG. 4, and more precisely is the size represented by the circle-equivalent diameter of the same area as the layer giving the largest area in electromagnetic absorption and photoelectric conversion part of multiple layers.

Figure 5:
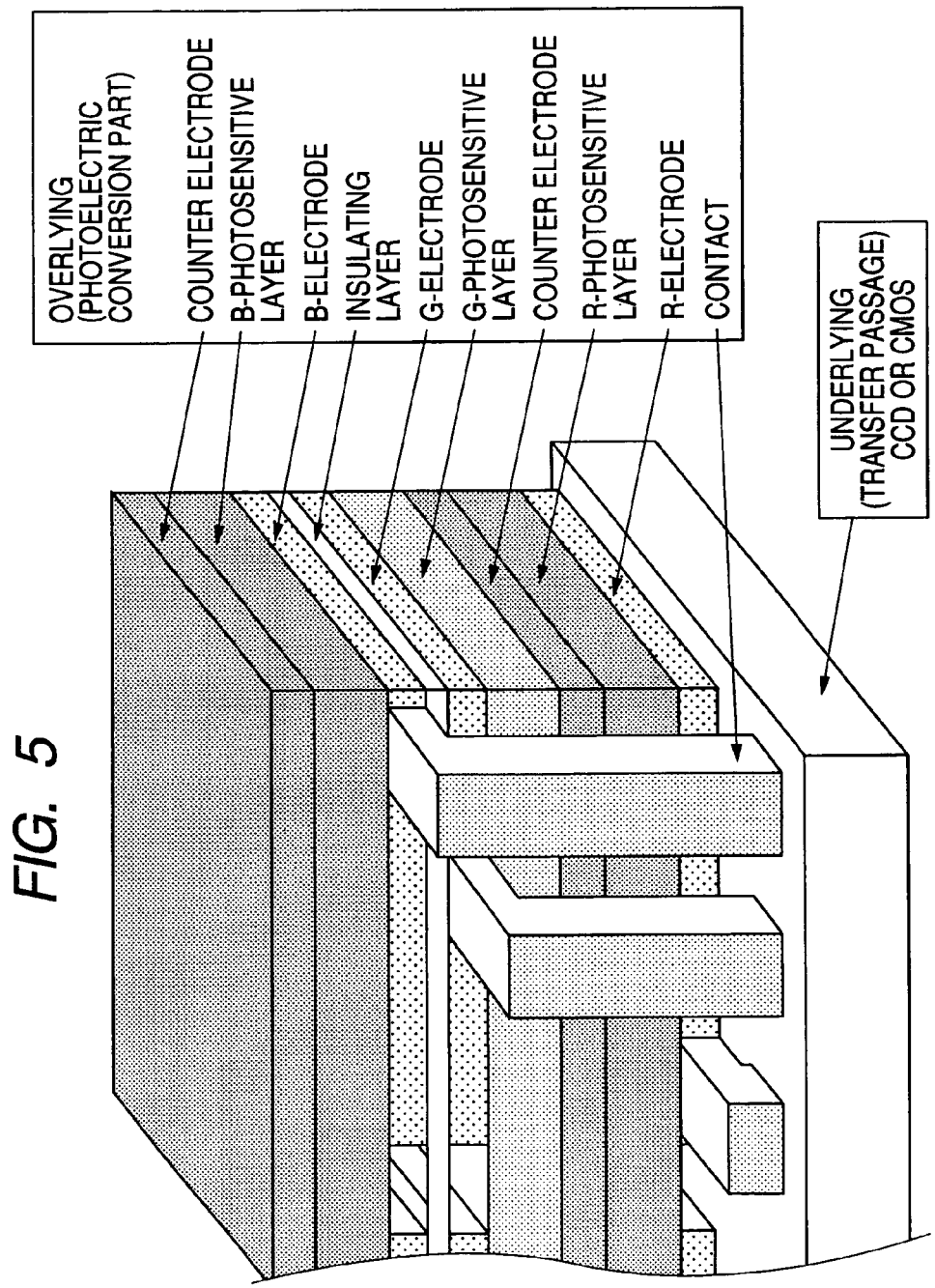
FIG. 5 is a perspective view to more specifically show the configuration of photoelectric conversion part and signal read and transfer part of the multilayer deposition multipixel image pickup device of the invention.

FIG. 5 is a perspective view to more specifically show the configuration of photoelectric conversion part and signal read and transfer part of each pixel of the multilayer deposition multipixel image pickup device of the invention described above. The part names and the functions of the parts are the same as those previously described with reference to FIG. 4, etc.

It was found that the features of high sensitivity, high resolution, and no occurrence of shading that the multilayer deposition multipixel image pickup device of the invention has are due to the fact that the thickness of electromagnetic absorption and photoelectric conversion part of multiple layers is thin relative to the pixel size.

The electromagnetic wave mentioned in the invention refers to visible light containing blue light, green, light, and intermediate color, extreme ultraviolet light, ultraviolet light, infrared light, far infrared light, X rays, and γ rays. The visible light is particularly important as application of image pickup device. In this case, responses to three colors of 400-500 nm blue light, 500-600 nm green light, and 600-700 nm red light are important; further responses to light of four to six types of wavelengths (or electromagnetic waves) also become important depending on the purpose. A system of absorbing blue light, cyan light, green light, and red light and executing photoelectric conversion is particularly preferred and produces large effect particularly for faithful color reproduction. As electromagnetic absorption and photoelectric conversion part with two or more layers of at least any of blue light, green light, or red light is provided, the preferred effect in widening the dynamic range (photographing latitude) can be produced.

A charge transfer and read part requires that the mobility of a charge be 100 $cm^2$/volt sec or more, and this mobility cab be provided as the material is selected from among IV-group, III-V group, and II-VI group semiconductors. Among them, a silicon semiconductor (Si semiconductor) is preferred because of advance in the microfabrication technology and low cost. A large number of charge transfer and charge read systems are proposed and any system may be adopted. Particularly preferred system is a device of CMOS or CCD type. Further, in the invention, the CMOS type is often preferred in high-speed read, pixel addition, partial read, power consumption, etc. As the chip size of the device, blowny size, 135 size, APS size, 1/1.8 size, or even smaller size can be selected.

A plurality of contact parts for joining the electromagnetic absorption and photoelectric conversion part and the charge transfer and read part may be joined by any metal; preferably it is selected from among copper, aluminum, sliver, gold, and chromium and particularly copper is preferred. As shown in FIGS. 4 and 5, in response to a plurality of electromagnetic absorption and photoelectric conversion parts, the corresponding contact part needs to be installed between each electromagnetic absorption and photoelectric conversion part and the charge transfer and read part. To adopt the deposition structure of blue, green, and red photosensitive units, it is necessary to join the blue light taking out electrode and the charge transfer and read part, join the green light taking out electrode and the charge transfer and read part, and join the red light taking out electrode and the charge transfer and read part.

The pixel size of the multilayer deposition multipixel image pickup device of the invention is represented by the circle-equivalent diameter corresponding to the largest area in a plurality of electromagnetic absorption and photoelectric conversion parts as previously described. If any pixel size is adopted, the advantages of the invention are provided so long as the relationship between the pixel size and the thickness between the upper and lower electrodes of the electromagnetic absorption and photoelectric conversion part defined in the invention is satisfied; however, the pixel size of 2 to 20 microns is preferred. More preferably, the pixel size is 2 to 10 microns; particularly preferably, the pixel size is 3 to 8 microns.

If the pixel size exceeds 20 microns, the advantages of the invention decrease and if the pixel size is smaller than 2 microns, the resolution is degraded because of radio interference between the sizes.

Preferably, the thickness of the electromagnetic absorption and photoelectric conversion part is 1 to 19 microns.

The advantage provided by the fact that the requirement of the ratio between the pixel size and the thickness between the upper and lower electrodes of the electromagnetic absorption and photoelectric conversion part in the invention is satisfied also depends on the chip size; if the image pickup element of the invention is applied to a 1M-100M pixel high-resolution image pickup device, the advantages are easily provided. Furthermore practically, preferably the size is 3M to 30M pixels; particularly preferably the size is 5M to 10M pixels.

The electromagnetic absorption and photoelectric conversion part needs to effectively absorb incident visible light of 400 to 700 nm. If 4800-K color temperature light is made incident, preferably the part absorbs 40% or more as integrated absorption; further preferably 60% or more; particularly preferably 70% or more.

Preferably, the electromagnetic absorption and photoelectric conversion part has an open area ratio of 70% or more; further preferably 80% or more; particularly preferably 90% or more.

Various materials and systems can be adopted for the electromagnetic absorption and photoelectric conversion part of the invention. Preferred material and system can be selected from among i) organic thin film system, ii) organic and inorganic hybrid system, and iii) inorganic particle and thin film system.

In the systems, the electromagnetic absorption and photoelectric conversion layer of the material described above is caught in at least one optically transparent electrode and further to promote photoelectric conversion, particularly preferably an electric field is applied to the optically transparent electrode. The optically transparent electrode can be selected from among oxides of indium, tin, antimony, etc., such as ITO and ATO, very thin metal films of silver, copper, gold, aluminum, etc., mesh electrodes of metal, and the like.

i) Organic Thin Film System

Preferably, the electromagnetic absorption and photoelectric conversion part adopting the organic thin film system is selected from among organic semiconductors having absorption in visible light and photoelectric conversion property (optical excitation for generating electron-hole pairs). The thickness of an organic thin film depends on the absorption coefficient of compound; preferably it is about 30 molecular layers to 300 molecular layers from the viewpoint of light absorption and photoelectric conversion efficiency. Preferably, as the charge mobility of the organic thin film, selection is made from $10^{-5}$ cm$^2$/v s or more in the ascending order of dark electric conductivity; particularly preferably $10^{-4}$ cm$^2$/v s or more.

Figure 6:
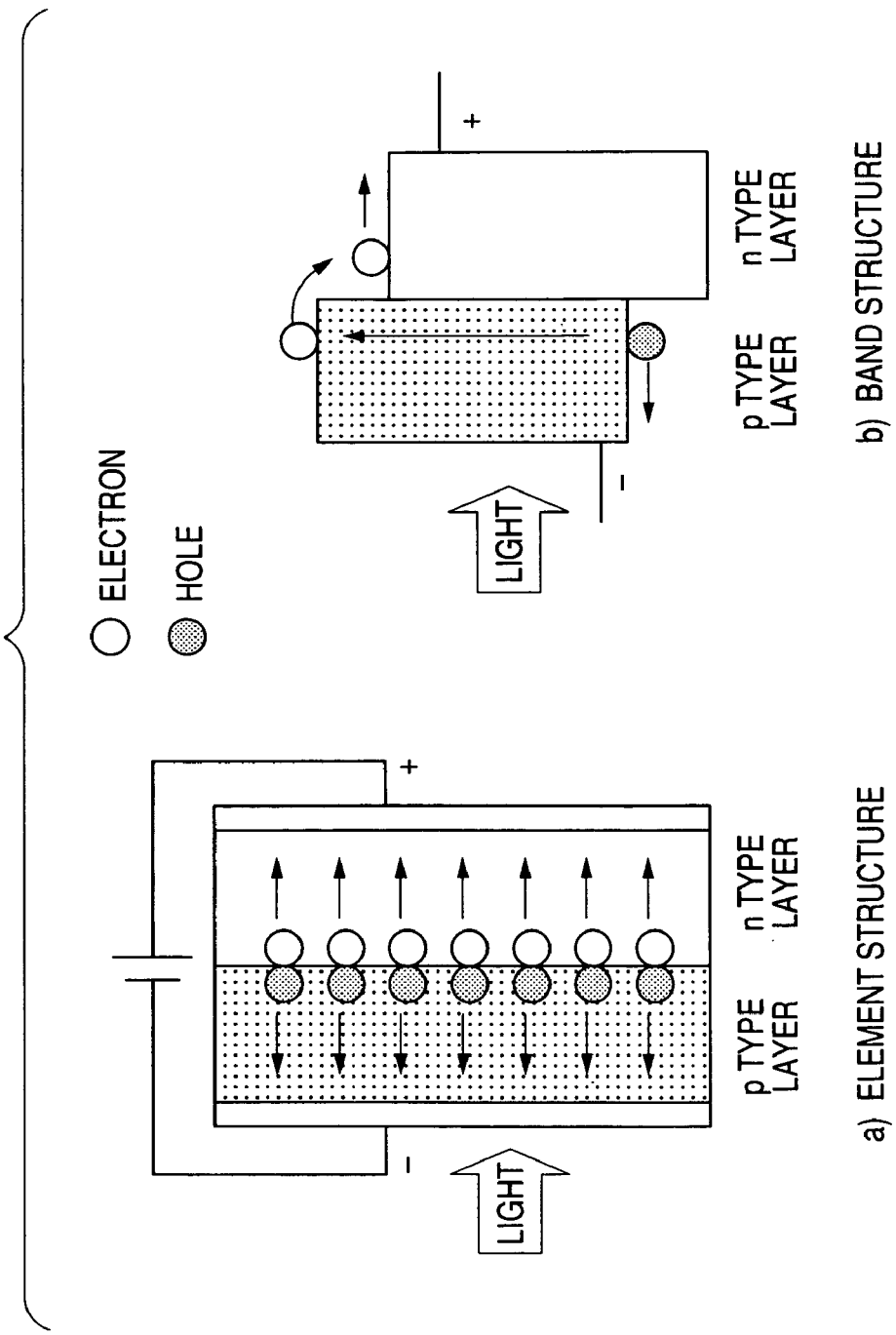
FIG. 6 is a drawing to schematically show the operation principle of a typical electromagnetic absorption and photoelectric conversion part of organic thin film type.

The operation principle of the electromagnetic absorption and photoelectric conversion part will be discussed. FIG. 6 is a drawing to schematically show the operation principle of a photosensitive unit of typical organic coloring matter thin molecular film and acceptor layer (or donor layer) type among the electromagnetic absorption and photoelectric conversion parts adopting the organic thin film. Members used with the photosensitive unit and the like are described in the figure.

The photosensitive unit adopts an element structure made up of a photosensitive monolayer (molecular film) (p-type layer in FIG. 6) and an acceptor-property monolayer (molecular film) (n-type layer in FIG. 6) as shown on the left side of FIG. 6. When light is applied to the photosensitive monolayer in the pixel, a photosensitive molecule can be optically excited, causing an electron-hole pair (carrier pair) to be produced in the photosensitive monolayer as shown in a band structure drawing on the right side of FIG. 6. At this time, the exited electron makes a transition to the acceptor-property monolayer (molecular film). The photoelectron making the transition is transferred to a read and transfer circuit as an electron or potential image signal.

If the light reception element has a donor-property monolayer (molecular film) (p-type layer in FIG. 6) rather than an acceptor-property monolayer (molecular film), as light is applied to a photosensitive molecule (n-type layer in FIG. 6) in the pixel, a hole makes a transition to a donor-property molecule. The electron move relationship between the photosensitive layer and the acceptor layer in FIG. 6 becomes opposite in the photosensitive layer and the donor layer, but the effect and mechanism are the same except for the point.

The preferred photosensitive monolayer (molecular film) forming a part of each photosensitive unit is a monolayer (molecular film) having coumarin 6 dispersed in PHPPS of binder polymer, for example, as the blue light absorption monolayer (molecular film), and has internal quantum efficiency of about 1%. It is a monolayer (molecular film) having rhodamine 6G dispersed in PMPS of binder polymer, for example, as the green light absorption monolayer (molecular film), and also has internal quantum efficiency of about 1%. It is a combination of organic coloring matter of red light excitation property and an electron transport layer or a hole transport layer, for example, as the red light absorption monolayer (molecular film); the electron transport layer is formed of AlQ$_3$ and the hole transport layer is formed of Zn phthalocyanine. The internal quantum efficiency is about 20%.

To adjust the spectrum of electromagnetic absorption and promote charge separation, preferably the electromagnetic absorption and photoelectric conversion part is formed of a plurality of organic compounds. As a representative example, a method of putting p-type and n-type organic compounds into multiple layers of two or more layers or a method of providing a mix layer of both organic compounds is available. Either can be selected in response to the purpose. Further, to create a multilayer film of organic compound, ordering of an array involving self-organization of the organic compound is very preferred for the invention.

ii) Organic and Inorganic Hybrid System

A substrate of the electromagnetic absorption and photoelectric conversion part adopting the organic and inorganic hybrid system can be selected from among oxides, sulfides, and their mix crystal such as TiO$_2$, ZnO, SnO$_2$, ZnS, CdS, ZnSe and CdSe. As the substrate, preferably a material with a large specific area as much as possible is selected from among nanoparticle aggregate, sintered substance, thin film, thin file with pores, and their mixtures. Using the surface, coloring matter of spectral sensitization type needs to be adsorbed. As the coloring matter of spectral sensitization type, various pigments and dyes known as photograph industry, electrophotography, color sensitization solar cell, etc.

The preferred pigments and dyes are as follows: Cyanine dye, styryl dye, hemicyanine dye, merocyanine dye (containing zero methine merocyanine (simple merocyanine)), 3-nucleus merocyanine dye, 4-nucleus merocyanine dye, rhodacyanine dye, complex cyanine dye, complex merocyanine dye, allopolar dye, oxynol dye, hemioxynol dye, squalium dye, cloconium dye, azamethine dye, coumarin dye, arylidene dye, anthraquinone dye, triphenylmethane dye, azo dye, azomethine dye, spiro compound, metallocene dye, fluorenone dye, flugide dye, perylene dye, phenazine dye, phenothiazine dye, chinone dye, indigo dye, diphenylmethane dye, polyene dye, acridine dye, acridinone dye, diphenylamine dye, quinacridone dye, quinofutalon dye, phenoxazine dye, phthaloperylene dye, porphyrin dye, chlorophyll dye, phthalocyanine dye, metal complex dye, and methine dyes such as cyanine dye, styryl dye, hemicyanine dye, merocyanine dye, 3-nucleus merocyanine dye, 4-nucleus merocyanine dye, rhodacyanine dye, complex cyanine dye, complex merocyanine dye, allopolar dye, oxynol dye, hemioxynol dye, squalium dye, cloconium dye, and azamethine dye.

Figure 7:
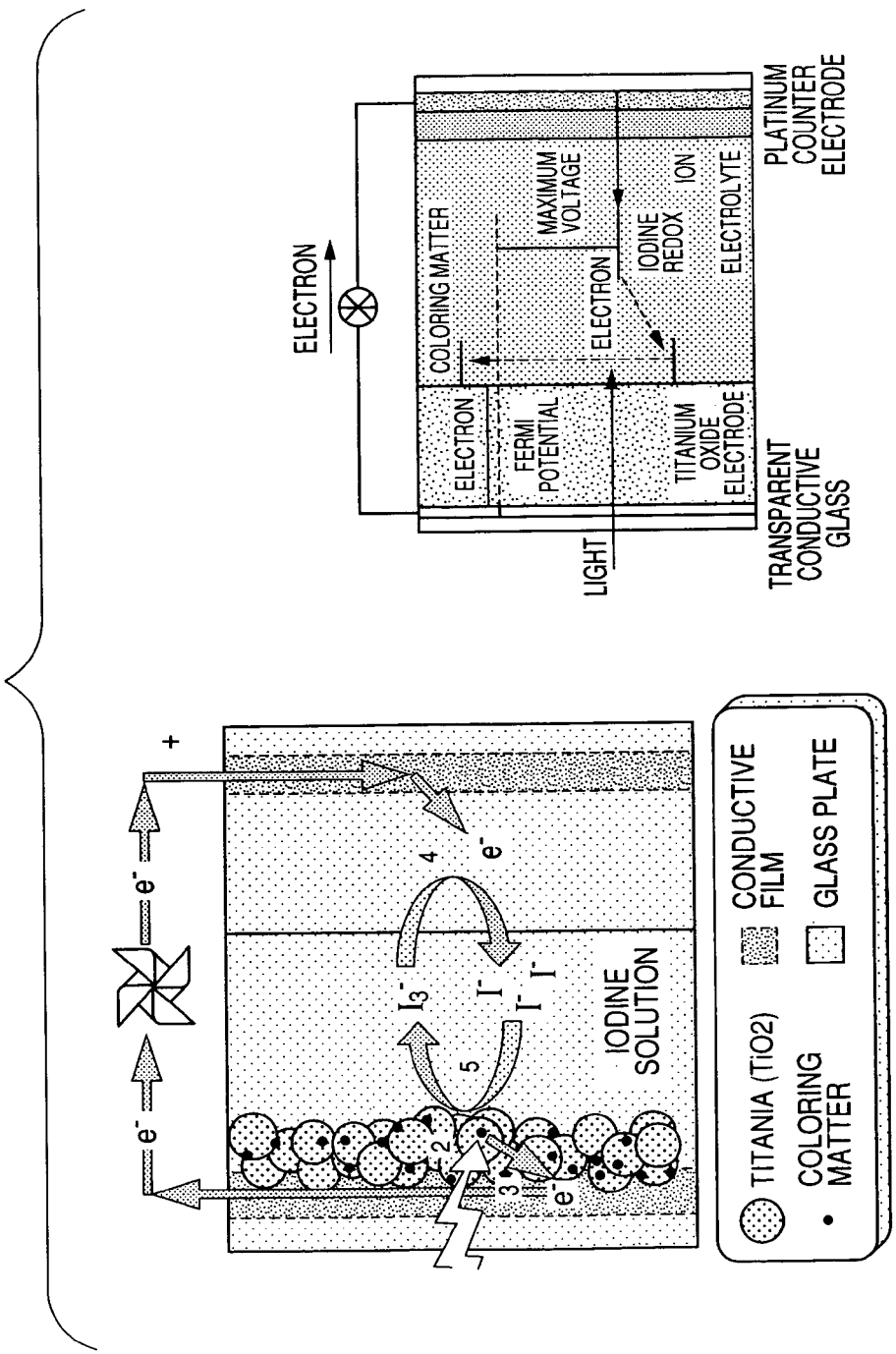
FIG. 7 is a drawing to schematically show the configuration and the operation principle of a photosensitive unit of single-layer coloring matter/inorganic substrate spectral sensitization type.

The photosensitive unit may be of single-layer coloring matter/inorganic substrate spectral sensitization type. FIG. 7 is a drawing to schematically show the configuration and the operation principle of a photosensitive unit of single-layer coloring matter/inorganic substrate spectral sensitization type. The component names and the effects and functions of the components are described in the figure.

Titania (titanium oxide) with photosensitive coloring matter adsorbed on the particle surfaces is placed on a conductive film to form a photosensitive layer in a schematic drawing of the configuration of the photosensitive unit on the left side of FIG. 7. When light is applied through a transparent glass plate, photosensitive coloring matter absorbs light in a spectral sensitization wave range, is excited, and forms electron-hole pairs and then excited electrons are accepted in titania particles. The electrons further are read to the conductive film and are transferred in the form of an image electric signal.

To promote charge separation, a mediater for promoting hole transport may be used in combination. Water-soluble redox, gel redox, or solid-state redox can be selected as the mediater; the solid-state redox is preferred for the invention and particularly CuI-based redox is preferred.

iii) Inorganic Particle and Thin Film System

The electromagnetic absorption and photoelectric conversion part adopting the inorganic particle and thin film system requires that an inorganic compound for absorbing visible light be selected. As examples, chalcogenide element, its compound, oxide, III-V group elements, their oxides, and the like are available. CdSe, CdS, and the like are available as the representatives. An aggregate, a sintered substance, or a thin film of fine particles of inorganic compound is preferred as the electromagnetic absorption and photoelectric conversion part. A material provided by compounding a inorganic compound having objective visible absorption and a compound having no objective visible absorption is also useful and can be selected from various modes such as a mode in which visible absorption fine particles are dispersed in the other and a mode in which both are formed like a layer. An adjustment method of an absorption spectrum using the quantum dot effect of nanoparticles by controlling the size of an inorganic fine particle compound and a size distribution is very preferred for the invention. By way of example, the absorption spectrum of the nanosize particles of CdSe can be adjusted according to the particle size; for example, blue light absorption can be provided as the particle size is in the neighborhood of 2 nm; green light absorption can be provided as the particle size is in the neighborhood of 5 nm; and red light absorption can be provided as the particle size is in the neighborhood of 8 nm. Therefore, the size and the size distribution are adjusted, whereby it is made possible to create a preferred spectrum, which is preferred for the invention.

<Manufacturing and Use Materials of Multipixel Image Pickup device>

The layer component materials and the manufacturing method of a multipixel image pickup device provided by depositing the electromagnetic absorption and photoelectric conversion parts of multiple layers described above will be further discussed.

For example, the application amounts of the elements used for the color sensitive layers and the electrode layers to be applied are adjusted for the pixel size of the picture element to be created in a manufacturing process described later with reference to FIG. 8, for example, and the thickness is made smaller than the pixel size, whereby the image pickup device of the invention can be provided. The elements and the creation methods thereof will be discussed below:

In the invention, preferably an optically transparent electrode is used for the electromagnetic absorption and photoelectric conversion part of multiple layers. By way of example, the optically transparent electrode can be selected from among oxides of indium, tin, antimony, etc., such as ITO and ATO, very thin metal films of silver, copper, gold, aluminum, etc., mesh electrodes of metal, and the like.

As the formation method, a laser abration method, a sputtering method, etc., can be used.

Any may be used as a compound having absorption in visible light in the organic thin film system; preferably cyanine dye, styryl dye, hemicyanine dye, merocyanine dye (containing zero methine merocyanine (simple merocyanine)), 3-nucleus merocyanine dye, 4-nucleus merocyanine dye, rhodacyanine dye, complex cyanine dye, complex merocyanine dye, allopolar dye, oxynol dye, hemioxynol dye, squalium dye, cloconium dye, azamethine dye, coumarin dye, arylidene dye, anthraquinone dye, triphenylmethane dye, azo dye, azomethine dye, spiro compound, metallocene dye, fluorenone dye, flugide dye, perylene dye, phenazine dye, phenothiazine dye, chinone dye, indigo dye, diphenylmethane dye, polyene dye, acridine dye, acridinone dye, diphenylamine dye, quinacridone dye, quinofutalon dye, phenoxazine dye, phthaloperylene dye, porphyrin dye, chlorophyll dye, phthalocyanine dye, and metal complex dye can be used.

To use the multipixel image pickup device as a color image sensor, one purpose of the invention, methine dyes such as cyanine dye, styryl dye, hemicyanine dye, merocyanine dye, 3-nucleus merocyanine dye, 4-nucleus merocyanine dye, rhodacyanine dye, complex cyanine dye, complex merocyanine dye, allopolar dye, oxynol dye, hemioxynol dye, squalium dye, cloconium dye, and azamethine dye high in flexibility of adjustment of absorption wavelength can be preferably used. More preferably, merocyanine dye, 3-nucleus merocyanine dye, and 4-nucleus merocyanine dye can be used, and more preferably merocyanine dye can be used.

The details of the methine dyes are described in the following coloring matter documents:

"Heterocyclic Compounds-Cyanine Dyes and Related Compounds" written by F. M. Harmer, John Wiley & Sons, New York, London, published in 1964, "Heterocyclic Compounds-Special topics in heterocyclic chemistry" written by D. M. Sturmer, Chapter 18, Section 14, pages 482 to 515, John Wiley & Sons, New York, London, published in 1977, "Rodd's Chemistry of Carbon Compounds" 2nd. Ed. vol. IV, part B, published in 1977, chapter 15, pages 369 to 422, Elsevier Science Publishing Company Inc.), New York, and the like.

Further, dyes described on pages 23 and 24 of Research Disclosure (RD) 17643, right column of page 648 to right column of page 649 of RD 18716, right column of page 996 to right column of page 998 of RD 308119, and lines 7 to 10 of page 65 of European Patent No. 0565096A1. Dyes having partial structures or structures shown in general formulae and specific examples described in U.S. Pat. No. 5,747,236 (particularly, pages 30 to 39), U.S. Pat. No. 5,994,051 (particularly, pages 32 to 43), and U.S. Pat. No. 5,340,694 (particularly, pages 21 to 58, however, in the coloring matter (dyes and pigments) shown in (XI), (XII), and (XIII), the number of n12, n15, n17, n18 is not limited and each an integer of 0 or more (preferably, 4 or less)) can also be used preferably.

The organic compound layers are formed by a dry film forming method or a wet film forming method. As specific examples of the dry film forming method, a vacuum evaporation method, an ion plating method, a physical vapor phase epitaxial method of MBE method, etc., or a CVD method of plasma polymerization, etc., can be named. As the wet film forming method, a cast method, a spin coating method, a dipping method, an LB method, etc., is used.

To use a high-molecular compound as a compound having absorption invisible light, preferably a wet film forming method to easily create is used for film formation. If the dry film forming method of evaporation, etc., is used, it is difficult to use a high polymer because there is a fear of decomposition; instead, oligomer can be used preferably.

On the other hand, if low-molecular material is used, preferably a wet film forming method of coevaporation, etc., is used for film formation.

A substrate in the organic and inorganic hybrid system can be selected from among oxides, sulfides, and their mix crystal such as $TiO_2$, $ZnO$, $SnO_2$, $ZnS$, $CdS$, $ZnSe$ and $CdSe$. As the substrate, preferably a material with a large specific area as much as possible is selected from among nanoparticle aggregate, sintered substance, thin film, thin file with pores, and their mixtures. Using the surface, coloring matter of spectral sensitization type needs to be adsorbed. As the coloring matter of spectral sensitization type, various pigments and dyes known as photograph industry, electrophotography, color sensitization solar cell, etc.

The substrate generally has a particle size in the range of nm to μm; preferably, the average particle size of primary particles found from the diameter when the projection area is converted into a circle is 1 to 200 nm, more preferably 1 to 10 nm.

Two or more different types of substrates may be mixed for use.

As a substrate manufacturing method, preferably a sol-gel method described in "Sol-gel hounokagaku" written by SAKKA Sumio, Agune Shoufuusha (1998), "Sol-gel houniyoru hakumaku coating gijyutu" published by Gijyutu Jyouhou Kyoukai (1995), etc., or a gel-sol method described in "Shingousehou gel-sol houniyoru tanbunsanryuusino gouseito size keitaiseigyo" written by SUGIMOTO Tadao, Materia, vol. 35, no. 9, pages 1012 to 1018 (1996) is used. A method of manufacturing oxide by high-temperature hydrolysis of chloride in oxyhydrogen flame, developed by Degussa is also preferred.

If the substrate is titanium oxide, the sol-gel method, the gel-sol method, and the method of manufacturing oxide by high-temperature hydrolysis of chloride in oxyhydrogen flame mentioned above are all preferred; further a sulfuric acid method and a chlorine method described in "Sanka titan bussei to ouyougijyutu" written by KIYONO Manabu, Gihoudou shuppan (1997) can also be used. Further, as the sol-gel method, a method described in "Journal of American Ceramic Society" written by Barbe et al., vol. 80, no. 12, pages 3157 to 3171 (1997) and a method described in "Chemistry of Materials" written by Burnside et al., vol. 10, no. 9, pages 2419 to 2425 are also preferred.

To apply semiconductor fine particles, not only a method of applying dispersion or colloidal solution of semiconductor fine particles, but also the sol-gel method, etc., can be used. A method of oxidizing metal, a method of precipitating in a liquid phase by ligand exchange, etc., from a metal solution (LPD method), a method of evaporating by sputtering, etc., a CVD method, or an SPD method of blowing a metal oxide precursor thermally cracked on a warmed substrate to form a metal oxide can be used.

As a method of preparing dispersion of semiconductor fine particles, a method of mashing with a glass mortar, a dispersing method while crushing using a mill, a method of precipitating as fine particles in a solvent when a semiconductor is synthesized and using intact, or the like can be named in addition to the above-mentioned sol-gel method.

As the applying method, preferably a roller method, a dip method, etc., is used as an application mode; an air knife method or a blade method is used as a metering mode; a wire bar method disclosed in JP-B-58-4589, a slide hopper method, an extrusion method, a curtain method, etc., described in U.S. Pat. Nos. 2,681,294, 2,761,419, 2761791, etc., or the like is used. As a general-purpose machine, a spin method or a spray method is also preferred. As a wet print method, intaglio, gum printing, screen printing, and the like as well as three major print methods of letterpress, offset, and gravure are preferred. A preferred film preparing method is selected from among them in response to the liquid viscosity and the wet thickness.

To bring substrate fine particles into electronic contact with each other after a substrate is applied onto an electrode and improve the coat strength and adherence to a support, preferably heating treatment is performed. The preferred heating temperature range is 40° C. to 700° C., more preferably 100° C. to 600° C. The heating time is about 10 minutes to 10 hours.

Preferably, the substrate has a large surface area so as to be able to adsorb much coloring matter. Preferably, the surface area with a layer of semiconductor fine particles applied onto a support is 10 times or more the projection area, further preferably 100 times or more. The upper limit is not limited, but usually is about 1000 times.

As sensitization coloring matter used for a photosensitive layer, any can be used if it is a compound having absorption in a visible range and a near infrared range and being capable of sensitizing a semiconductor; preferably metal complex dye, methine dye, porphyrin-based dye, or phthalocyanine-based dye is used and preferably methine dye is used.

The preferred methine dyes used in the invention are polymethine dyes such as cyanine dye, merocyanine dye, and squalium dye. As examples of the polymethine dyes used preferably in the invention, coloring matter (dyes and pigments) described in JP-A-11-35836, JP-A-11-67285, JP-A-11-86916, JP-A-11-97725, JP-A-11-158395, JP-A-11-163378, JP-A-11-214730, JP-A-11-214731, JP-A-11-238905, JP-A-2000-26487, and European Patent Nos. 892411, 911841, and 991092 can be named.

The inorganic particle and thin film system requires that an inorganic compound for absorbing visible light be selected. As examples, chalcogenide, oxides, III-V group, and the like are available. CdSe, CdS, and the like are available as the representatives. An aggregate, a sintered substance, or a thin film of fine particles of inorganic compound is preferred as the electromagnetic absorption and photoelectric conversion part. A material provided by compounding an inorganic compound having objective visible absorption and a compound having no objective visible absorption is also useful and can be selected from various modes such as a mode in which visible absorption fine particles are dispersed in the other and a mode in which both are formed like a layer. An adjustment method of an absorption spectrum using the quantum dot effect of nanoparticles by controlling the size of an inorganic fine particle compound and a size distribution is very preferred for the invention. By way of example, the absorption spectrum of the nanosize particles of CdSe can be adjusted according to the particle size; for example, blue light absorption can be provided as the particle size is in the neighborhood of 2 nm; green light absorption can be provided as the particle size is in the neighborhood of 5 nm; and red light absorption can be provided as the particle size is in the neighborhood of 8 nm. Therefore, the size and the size distribution are adjusted, whereby it is made possible to create a preferred spectrum, which is preferred for the invention.

A preparing method of semiconductor ultrafine particles popularly known as core-shell type having chalcogenide cadmium semiconductor ultrafine particles as the core and a chalcogenide zinc semiconductor as the shell is described in J. Phys. Chem. B vol. 101, (1997) 9463 to 9475 written by B. O. Dabbousi et al. An example of forming a sulfide shell of zinc sulfide (ZnS), CdS, etc., by a reversed micelle method or a reaction method wherein semiconductor ultrafine particles come in contact with water such as water solution reaction is reported. That is, formation of a ZnS shell to a CdS core (in addition, discussion of Cd(OH)2 and CdO as shell material) is reported in B. S. Zou et al.; International Journal of Quantum Chemistry, vol. 72, 439 to 450 (1999), and formation of a CdS shell to a CdSe core is reported in L. Xu et al.; J. Mater. Sci., vol. 35, 1375 to 1378 (2000).

As means for applying the semiconductor ultrafine particles onto an electrode, known means can be used; for example, dispersion of an organic solvent can be prepared and can be applied by spin coating.

The multilayer deposition multipixel image pickup device of the invention can be manufactured according to a microfabrication process used for manufacturing a known integrated circuit, etc.

Basically, this method is accomplished by repetitive operation of pattern light exposure using active light, an electron beam, etc., (i, gline of silver, excimer laser, further X ray, electron beam), pattern formation by developing and/or burning, placing of element forming materials (applying, evaporation, sputtering, CV, etc.,), and removal of non-pattern portion material (thermal treatment, dissolution treatment, etc.,).

Figure 8A:
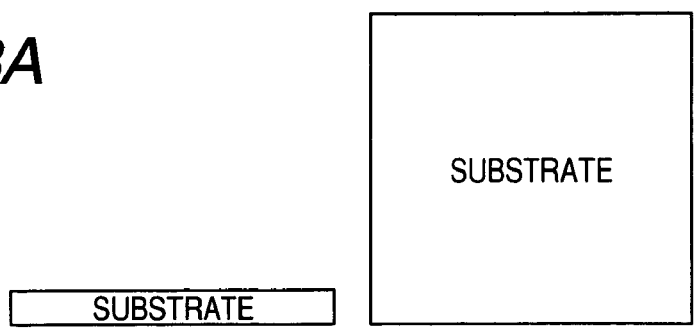
FIGS. 8A to 8D are drawings to schematically show initial steps a to d of a manufacturing process of the multilayer deposition multipixel image pickup device of the invention.

A typical example will be discussed with reference to FIGS. 4 and 8. FIG. 8 shows a part of a manufacturing process to describe the manufacturing process, and FIG. 8A is a plan view and an elevational view of a substrate (underlying) of a starting material. Impurity areas for a source and a drain and a gate electrode formed through a gate insulating film 8 are formed on the surface of a substrate (underlying) written as N-sub in FIG. 4, an insulating film is further deposited on the tops of the gate insulating film 8 and the gate electrode and is flattened, and a light shield film (not shown) is formed on the insulating film. Since the light shield film is often formed of a metal thin film, an insulating film is further deposited on the light shield film to prepare a semiconductor substrate shown as a plan view and an elevational view of FIG. 8B (below the insulating layer indicated by two arrows in FIG. 2).

A photoelectric conversion film which becomes a light reception section is deposited on the described semiconductor substrate. First, a counter electrode film partitioned for each pixel is formed on the insulating film of the substrate. To do this, a resist is applied onto the counter electrode film and an electrode hole is made (FIG. 8C). Next, after evaporation or applying is performed, the resist is removed and a pillar electrode is placed in the hole as shown in FIG. 8D. The electrode establishes continuity between the counter electrode film and the underlying high-density impurity area. The pillar electrode is electrically insulated from other parts than the counter electrode film or the underlying high-density impurity area.

Such resist application, patter drawing on the coat (or direct drawing of electron beam or X rays), resist removal, and burning are repeated for manufacturing a picture element.

Figure 8B:
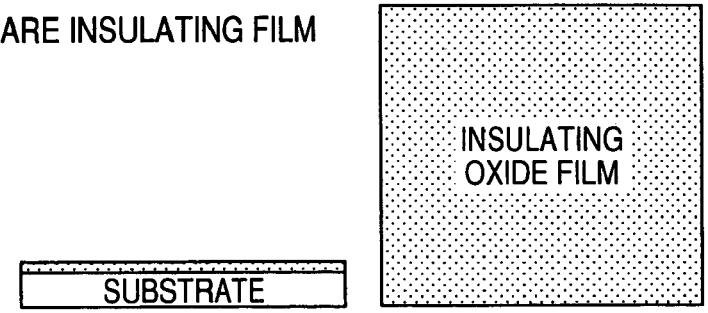
Figure 8C:
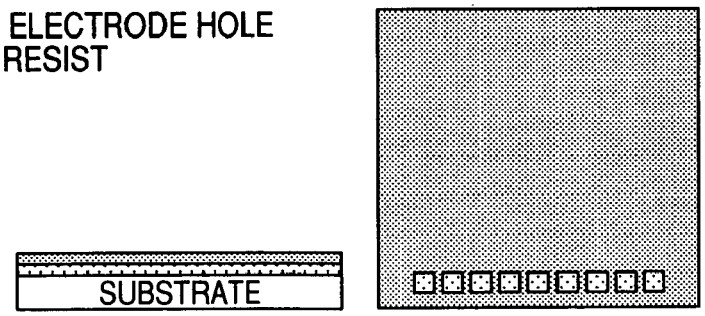
Figure 8D:
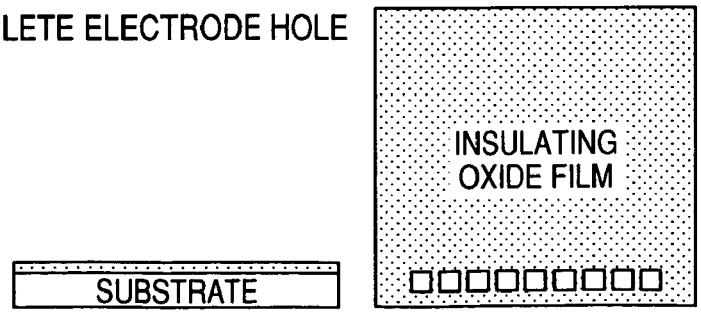

When a contact hold is provided according to FIGS. 8C and 8D on the substrate in FIG. 8B, a similar process is repeated, whereby, for example, a photoelectric conversion film for red detection is partitioned for each pixel and is deposited on the counter electrode film and further a transparent common electrode film is deposited on the photoelectric conversion film.

A photoelectric conversion film for green detection partitioned for each pixel is deposited on the common electrode film and a transparent counter electrode film partitioned for each pixel is deposited on the photoelectric conversion film. The counter electrode film is continued with the high-density impurity area of the corresponding pixel by the pillar electrode. The pillar electrode is electrically insulated from other parts than the counter electrode film or the high-density impurity area.

A transparent insulating film is deposited on the counter electrode film and a transparent counter electrode film partitioned for each pixel is deposited on the transparent insulating film. Each counter electrode film is continued with the high-density impurity area of the corresponding pixel by the pillar electrode. The pillar electrode is electrically insulated from other parts than the counter electrode film or the high-density impurity area.

A photoelectric conversion film for blue detection partitioned for each pixel is deposited on the counter electrode film, a transparent common electrode film is deposited on the photoelectric conversion film, and a transparent protective film is deposited on the top layer.

On the described photoelectric conversion film deposition solid-state image pickup device, when light is incident from a subject, photocharges responsive to the incident light amount of blue light occur on the photoelectric conversion film and when a voltage is applied between the common electrode film and the counter electrode film, the photocharges of the blue light flow into the high-density impurity area.

Likewise, when photocharges responsive to the light amount of green light of the incident light occur on the photoelectric conversion film and a voltage is applied between the common electrode film and the counter electrode film, the photocharges of the green light flow into the high-density impurity area.

Likewise, when photocharges responsive to the light amount of red light of the incident light occur on the photoelectric conversion film and a voltage is applied between the common electrode film and the counter electrode film, the photocharges of the red light flow into the high-density impurity area. Then, a signal responsive to the signal charges in each high-density impurity area is read to the outside by a MOS circuit, for example.

In the description given above, the case where the light absorption and photoelectric conversion layer is three photosensitive layers of red, green, and blue has been described. However, for a pixel unit to which a further light absorption and photoelectric conversion layer of a blue green layer (GB intermediate color, emerald green, etc.,) is added, the layer can also be deposited in a similar manner to described above and the absorption and photoelectric conversion process of incident light also proceeds in a similar manner to described above.

In the embodiment, a signal is read by the MOS circuit formed on the semiconductor substrate, but the accumulated charges in the high-density impurity area for color signal storage can also be moved along a vertical transfer passage and be read to the outside along a horizontal transfer passage as with a CCD image sensor in a related art.

<Mode of Use of Image Pickup Device>

The image pickup device of the invention can be used for a digital still camera. It is also preferred that the image pickup device is used for a TV camera. Other possible uses of the image pickup device are as follows: A digital video camera, a monitor camera (for an office building, a parking lot, a financial institution, an unattended contracting machine, a shopping center, a convenience store, an outlet mall, a department store, a pachinko hall, a caraoke box, a gaming center, a hospital), various sensors (a TV door phone, an identity authentication sensor, a factory automation sensor, a home robot, an industrial robot, a piping inspection system), a medical sensor (endoscope, retinal camera), a television conference system, a videophone, a mobile telephone with a camera, an automobile safety running system (a back guide monitor, collision prediction, lane maintaining system), a video game sensor, etc.

Among them, the image pickup device of the invention is also appropriate for a TV camera, since miniaturization and weight reduction of a TV camera can be accomplished because no color separation optical system is required. Since the image pickup device has high sensitivity and high resolution, it is particularly preferred for the use of a TV camera for high-definition television. This TV camera for high-definition television contains a camera for digital high-definition television.

Further, in the image pickup device of the invention, the electromagnetic absorption and photoelectric conversion part can be created so as to have substantially no sensitivity to infrared light, so that the need for an optical low-pass filter can be eliminated and higher sensitivity and higher resolution can be expected.

Further, the image pickup device of the invention can be thinned and a color separation optical system becomes unnecessary. Thus, the image pickup device of the invention is changed for taking a photograph for photographing scenes requiring different sensitivity and other photographing scenes different in requirements for the spectral sensitivity and the color reproducibility, such as "environments different in brightness as during the daytime and during the nighttime" and "still subject and moving subject," whereby various photographing needs can be met using one camera and it is not necessary to carry two or more cameras at the same time, so that the load on the photographer is also lightened. As the image pickup device to be changed, image pickup devices can be provided for the purposes of infrared light photographing, monochrome photographing, and dynamic range change in addition to the image pickup device described above.

A TV camera of the invention can be manufactured by referencing the description of Chapter 2 of "Television camera nosekkeigijyutu" edited by Eizou Jyouhou Media Gakkai (Aug. 20, 1999, published by Koronasha, ISBN 4-339-00714-5) and replacing the parts of the color separation optical system and the image pickup device in the basic configuration of the TV camera in FIG. 2.1, for example, with the image pickup device of the invention.

As the multilayer deposition multipixel image pickup device of the invention characterized in that the thickness of the electromagnetic absorption and photoelectric conversion part layers is thinner than the pixel size, a high-sensitivity and high-resolution image pickup device with no occurrence of shading can be realized. An image pickup device having high photoelectric conversion efficiency and excellent in stability at the repetitive use time can be provided. The described advantages of the invention are demonstrated remarkably when the pixel size of the image pickup device is high density of 2 to 20 microns.

The entire disclosure of each and every foreign patent application from which the benefit of foreign priority has been claimed in the present application is incorporated herein by reference, as if fully set forth.

What is claimed is:

1. A multilayer deposition multipixel image pickup device comprising a pixel unit,
    wherein the pixel unit comprises:
    a plurality of electromagnetic absorption layers being capable of absorbing electromagnetic waves of different wavelengths and performing photoelectric conversion;
    at least one pair of electrodes that sandwich each of electromagnetic absorption layers;
    a charge transfer and charge read part; and
    a plurality of contact parts that couple at least one of the electrodes and the charge transfer and charge read part,
    wherein a length between outermost surfaces of ones among electrodes of the pixel unit is smaller than a pixel size that is a circle-equivalent diameter of the same area as a first electromagnetic absorption layer of the electromagnetic absorption layers, the first electromagnetic absorption layer having a largest area in said plurality of electromagnetic absorption layers.

2. The multilayer deposition multipixel image pickup device as claimed in claim 1,
    wherein at least one of said plurality of electromagnetic absorption layers absorbs any of blue light, green light, red light, ultraviolet light, infrared light, X rays, and γ rays and performs the photoelectric conversion.

3. The multilayer deposition multipixel image pickup device as claimed in claim 1, wherein said plurality of electromagnetic absorption layers have at least three electromagnetic absorption layers for absorbing 400-500 nm blue light, 500-600 nm green light, and 600-700 nm red light and performing the photoelectric conversion.

4. The multilayer deposition multipixel image pickup device as claimed in claim 1, wherein the charge transfer and charge read part is a semiconductor having charge mobility of 100 $cm^2$/volt sec or more.

5. The multilayer deposition multipixel image pickup device as claimed in claim 1, wherein the charge transfer and charge read part has one of a CMOS structure and a CCD structure.

6. The multilayer deposition multipixel image pickup device as claimed in claim 1, wherein said plurality of contact parts comprise metal material.

7. The multilayer deposition multipixel image pickup device as claimed in claim 1, wherein said plurality of contact parts include at least three contact parts for coupling an electrode for taking out blue light and the charge transfer and charge read part, coupling an electrode for taking out green light and the charge transfer and charge read part, and coupling an electrode for taking out red light and the charge transfer and charge read part.

8. The multilayer deposition multipixel image pickup device as claimed in claim 1, wherein the pixel size is 2 to 20 μm.

9. The multilayer deposition multipixel image pickup device as claimed in claim 1, wherein the image pickup device comprises 1M to 100M pixels.

10. The multilayer deposition multipixel image pickup device as claimed in claim 1, wherein said plurality of electromagnetic absorption layers absorb 40% or more of incident visible light of 400 to 700 nm as a whole and the perform photoelectric conversion.

11. The multilayer deposition multipixel image pickup device as claimed in claim 1, wherein an electromagnetic absorption layer having the maximum open area ratio among said plurality of electromagnetic absorption layers has an open area ratio of 70% or more.

12. The multilayer deposition multipixel image pickup device as claimed in claim 1, wherein said plurality of electromagnetic absorption layers comprise four electromagnetic absorption layers for absorbing at least blue light, blue green light, green light, and red light.

13. The multilayer deposition multipixel image pickup device as claimed in claim 3, wherein at least one of the electromagnetic absorption layer for absorbing blue light, the electromagnetic absorption layer for absorbing green light, and the electromagnetic absorption layer for absorbing red light is comprises two or more electromagnetic absorption layers.

14. The multilayer deposition multipixel image pickup device as claimed in claim 1, wherein at least one of said plurality of electromagnetic absorption layers comprises an organic compound film.

15. The multilayer deposition multipixel image pickup device as claimed in claim 1, wherein at least one of said plurality of electromagnetic absorption layers comprises a plurality of organic compound films.

16. The multilayer deposition multipixel image pickup device as claimed in claim 1, wherein at least one of said plurality of electromagnetic absorption layers contains oxide or chalcogenide semiconductor and spectral sensitization coloring matter.

17. The multilayer deposition multipixel image pickup device as claimed in claim 1, wherein at least one of said plurality of electromagnetic absorption layers contains at least one of: inorganic compound particles; an inorganic compound thin film; and a complex of the inorganic compound particles and the inorganic compound thin film.

18. A broadcasting television camera comprising an image pickup device as claimed in claim 1.

19. The broadcasting television camera as claimed in claim 18 comprising no optical low-pass filter.

20. The broadcasting television camera as claimed in claim 18, wherein the image pickup device can be changed.

21. The broadcasting television camera as claimed in claim 18, wherein the broadcasting television camera is used for high-definition broadcasting.

* * * * *